(12) United States Patent
Amrutur et al.

(10) Patent No.: US 8,442,464 B2
(45) Date of Patent: May 14, 2013

(54) LOW NOISE AMPLIFIER AND MIXER

(75) Inventors: Bharadwaj Amrutur, Bangalore (IN); Kannan Aryaperumal Sankaragomathi, Tamilnadu (IN)

(73) Assignee: Indian Institute of Science Bangalore, Karnataka (IN)

( * ) Notice: Subject to any disclaimer, the term of this patent is extended or adjusted under 35 U.S.C. 154(b) by 708 days.

(21) Appl. No.: 12/551,038

(22) Filed: Aug. 31, 2009

(65) Prior Publication Data

US 2010/0301948 A1 Dec. 2, 2010

(30) Foreign Application Priority Data

May 27, 2009 (IN) .......................... 1225/CHE/2009

(51) Int. Cl.
*H04B 1/06* (2006.01)
*H04B 1/00* (2006.01)

(52) U.S. Cl.
USPC ...................................... 455/234.1; 455/341

(58) Field of Classification Search .............. 455/234.1, 455/194.2, 230, 329, 330, 341
See application file for complete search history.

(56) References Cited

U.S. PATENT DOCUMENTS

| | | | |
|---|---|---|---|
| 6,154,099 A | 11/2000 | Suzuki et al. | |
| 6,298,221 B1 | 10/2001 | Nguyen | |
| 6,980,786 B1 | 12/2005 | Groe | |
| 7,023,272 B2 * | 4/2006 | Hung et al. | 330/126 |
| 7,110,742 B2 | 9/2006 | Roufoogaran | |
| 2005/0110575 A1 * | 5/2005 | Sivonen et al. | 330/302 |
| 2008/0297259 A1 | 12/2008 | Mu | |
| 2009/0251217 A1 * | 10/2009 | Keerti | 330/264 |
| 2009/0295472 A1 * | 12/2009 | Vice | 330/51 |

FOREIGN PATENT DOCUMENTS

JP 7288437 A 10/1995

OTHER PUBLICATIONS

Kim J.J., Jin K.T., Lee D.H. and Park, S.B., "A CMOS Single Chip Wireless Solution with an Adaptive Purity-Control Scheme Against ISM-Band Interferences", IEEE Transactions on Circuits and Systems—II, Express Briefs, Apr. 10, 2006, vol. 53, No. 4, pp. 269-273. doi: 10.1109/TCSII.2005.862179.
Tasic, et al., "Design of Adaptive Multi-mode RF Circuits", IEEE Journal of Solid-State Circuits, vol. 42, No. 2, pp. 313-322, Feb. 2007.
Written Opinion and International Search Report issued by the Australian Patent Office in International Patent Application serial No. PCT/IB2010/001132.

* cited by examiner

*Primary Examiner* — Yuwen Pan
*Assistant Examiner* — Fatuma Sherif
(74) *Attorney, Agent, or Firm* — Steven S. Rubin, Esq.; Moritt Hock & Hamroff LLP

(57) ABSTRACT

A low noise amplifier (LNA) system with controllable linearity and noise figure versus power consumption is provided. The system comprises two control inputs for tuning. One input controls an effective transistor width, and the other input controls bias current. Changes to the effective transistor width alter a gain that is applied to a signal, and changes to the bias current alter a power consumption of the system. For more stringent signal specifications, an impedance matched inductive degeneration variation of the LNA is provided.

22 Claims, 9 Drawing Sheets

LOW NOISE AMPLIFIER AND MIXER

CROSS-REFERENCE TO RELATED APPLICATION

The present application claims priority under 35 U.S.C. §119(d) to a corresponding patent application filed in India and having application number 1225/CHE/2009, filed on May 27, 2009, the entire contents of which are herein incorporated by reference.

BACKGROUND

Radio communication has become an integral aspect of everyday life in modern society, with a broad range of possible applications. Regardless of the application, clear communication between radio transmitters and radio receivers may be desired. How clear radio communication is, may depend on a number of factors, including signal strength, noise of the device, and interference power. Radio receivers are often designed to meet a worst case scenario for a received signal strength, noise of the devices, and interference power. As such, over-design of receiver components is common, resulting in a waste of power when channel conditions are more benign. This presents an area where power optimization can be improved.

In radio receiver circuit designs, high amplifier gain linearity and minimal noise figures may also be desirable. Noise is an undesirable product of electronic devices and components. One metric for noise figures is a noise factor, which is a measure of how much noise is introduced into the signal being amplified during an amplification process. A noise factor can be a ratio of Signal to Noise Ratio (SNR) of an input signal to the SNR of the amplified output signal.

A radio receiver amplifier with high linearity indicates an ability to control an applied gain. For example, an input signal can be amplified in a linear fashion so as not to modify the signal in any way except amplitude. An ideal amplifier would be a totally linear device, but real amplifiers are only linear within certain practical limits. When an input signal to the amplifier is increased, the output amplified signal also increases until a point is reached where some part of the amplifier becomes saturated and cannot produce any more output. This is typically referred to as clipping, and results in distortion. Amplifiers can be designed to handle clipping in a controlled manner that causes a reduction in gain to occur instead of excessive distortion, for example.

SUMMARY

In one embodiment, a receiver circuit is provided that includes a plurality of amplifying transistors connected in series and for amplifying an input signal. The receiver circuit also includes a plurality of control transistors each of which is connected to one of the plurality of amplifying transistors. Each control transistor receives an independent control signal at a gate of the control transistor and outputs to one of the amplifying transistors so as to provide for independent operation of each of the plurality of amplifying transistors. A number of the plurality of amplifying transistors in operation corresponds to a transistor width of the receiver circuit. The receiver circuit also includes a bias generation circuit including circuitry that mimics operation of the plurality of amplifying transistors and the plurality of control transistors. The bias generation circuit receives the independent control signals and an RF bias current input and outputs an RF bias voltage to the plurality of amplifying transistors that corresponds to a value of the transistor width. The independent control signals and the RF bias current input are independently tunable.

In another embodiment, a method of adjusting operating characteristics of a receiver is provided that includes receiving a radio frequency (RF) input signal, evaluating a signal quality of the RF input signal to determine whether the RF input signal substantially meets a noise figure and linearity requirement, and adjusting a gain of the receiver based on the evaluation of the RF input signal by receiving independent control signals at gates of control transistors that each output to one of a plurality of amplifying transistors within the receiver so as to provide for independent operation of each of the plurality of amplifying transistors to control the gain of the receiver. A number of the plurality of amplifying transistors in operation corresponds to a transistor width of the receiver circuit. The method also includes adjusting a bias current based on the transistor width of the receiver circuit and independently of the independent control signals, amplifying the RF input signal using the adjusted gain and adjusted bias current values, and outputting the amplified RF input signal.

In yet another embodiment, an inductively degenerated low noise signal amplifier is provided that includes a first inductive circuit and a second inductive circuit. The first inductive circuit includes a first plurality of amplifying transistors connected in series and for amplifying an input signal, and a first plurality of control transistors each of which is connected to one of the first plurality of amplifying transistors. Each first control transistor receives an independent control signal at a gate of the first control transistor and outputs to one of the first amplifying transistors so as to provide for independent operation of each of the first plurality of amplifying transistors. A number of the first plurality of amplifying transistors in operation corresponds to a transistor width of the receiver circuit. The second inductive circuit includes a second plurality of amplifying transistors connected in series and receiving an output of the first plurality of amplifying transistors, and a second plurality of control transistors each of which is connected to one of the second plurality of amplifying transistors. Each second control transistor receives an independent control signal at a gate of the second control transistor and outputs to one of the second amplifying transistors so as to provide for independent operation of each of the second plurality of amplifying transistors. A number of the second plurality of amplifying transistors in operation corresponds to the transistor width of the receiver circuit, and wherein adjusting a gain of the second plurality of amplifying transistors adjusts an inductance of the first inductive circuit and the second inductive circuit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
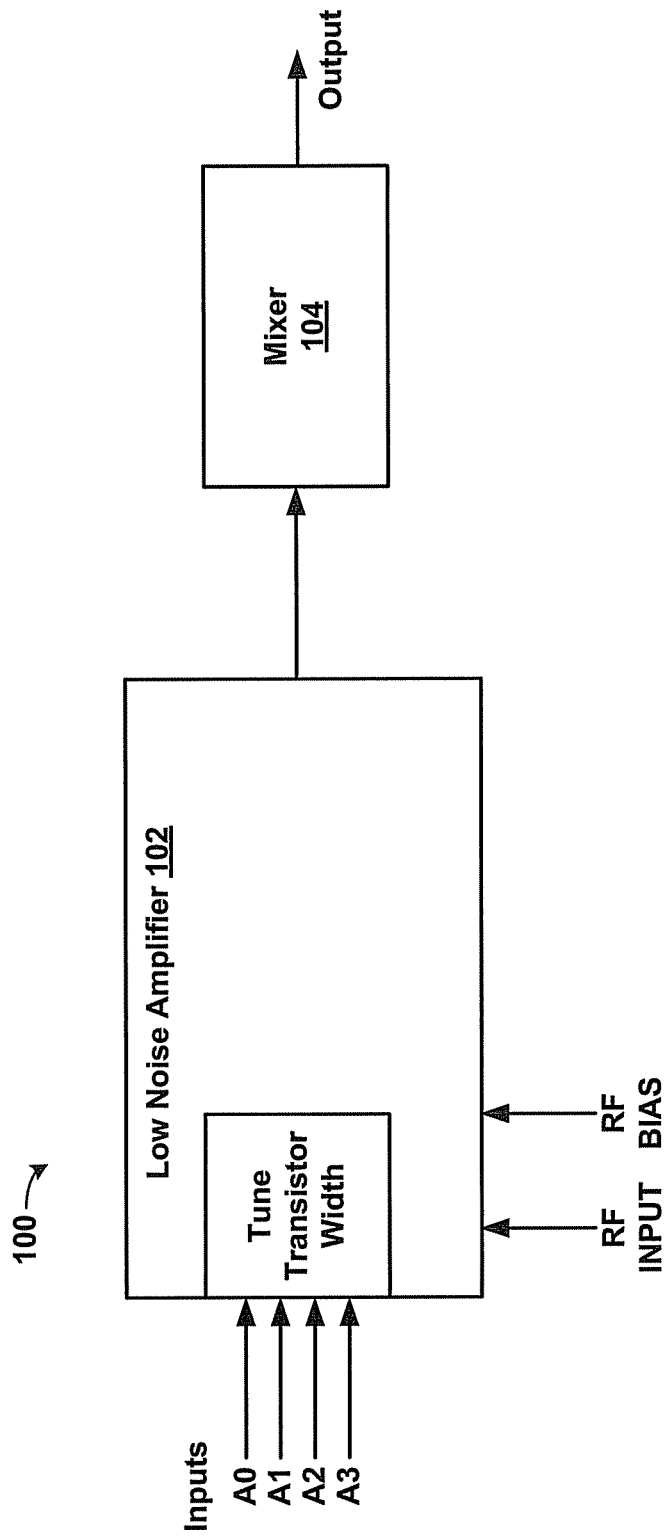
FIG. 1 is a block diagram of an example circuit including a low noise amplifier and a mixer.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Embodiments below can provide a system that allows control of linearity and noise figures of a low noise amplifier and mixer during periods of varying power consumptions. The system includes two control knobs for the circuits, and one control knob receives inputs to change transistor widths and the other control knob receives inputs to change bias currents. These two control knobs can set two design parameters of noise figure and linearity in an independent fashion.

The system may be configured according to current or existing operating conditions, rather than be configured to always meet a worst case specification for received signal strength, noise of the devices and interference power, for example. When signal conditions in terms of received signal power and interference change, the system may minimize power consumption, for example.

FIG. 1 shows a block diagram of an example receiver circuit 100 with a low noise amplifier 102 and a mixer 104. The low noise amplifier 102 of this illustrative embodiment receives inputs A0, A1, A2, and A3, and voltage inputs RF input and RF BIAS. The RF input is a radio frequency signal that is received through or via an antenna (not shown). The low noise amplifier 102 selectively amplifies the RF input based on the inputs A0-A3 as discussed in more detail herein. The mixer 104 receives signals after the selective amplification of the RF input by the low noise amplifier 102.

Generally, the low noise amplifier 102 includes transistors to apply a gain to a received signal. By applying a gain, the transistors improve a signal-to-noise ratio (SNR) of the RF input signal. In this illustrative embodiment, the inputs A0-A3 determine a number of transistors that are used to amplify the RF signal, and thus, the inputs A0-A3 effectively control how much the SNR of the RF input is improved. If the RF input signal is considerably clean and does not include much interference, fewer transistors are needed to meet a noise figure requirement. However, if the RF input is noisy, more transistors may be required to meet the same noise figure requirement. A typical noise figure requirement depends on a type of receiver being used, however, one particular example of a noise figure requirement for an LNA of a ZigBee receiver is typically in the range of about 7-8 dB.

Figure 2:
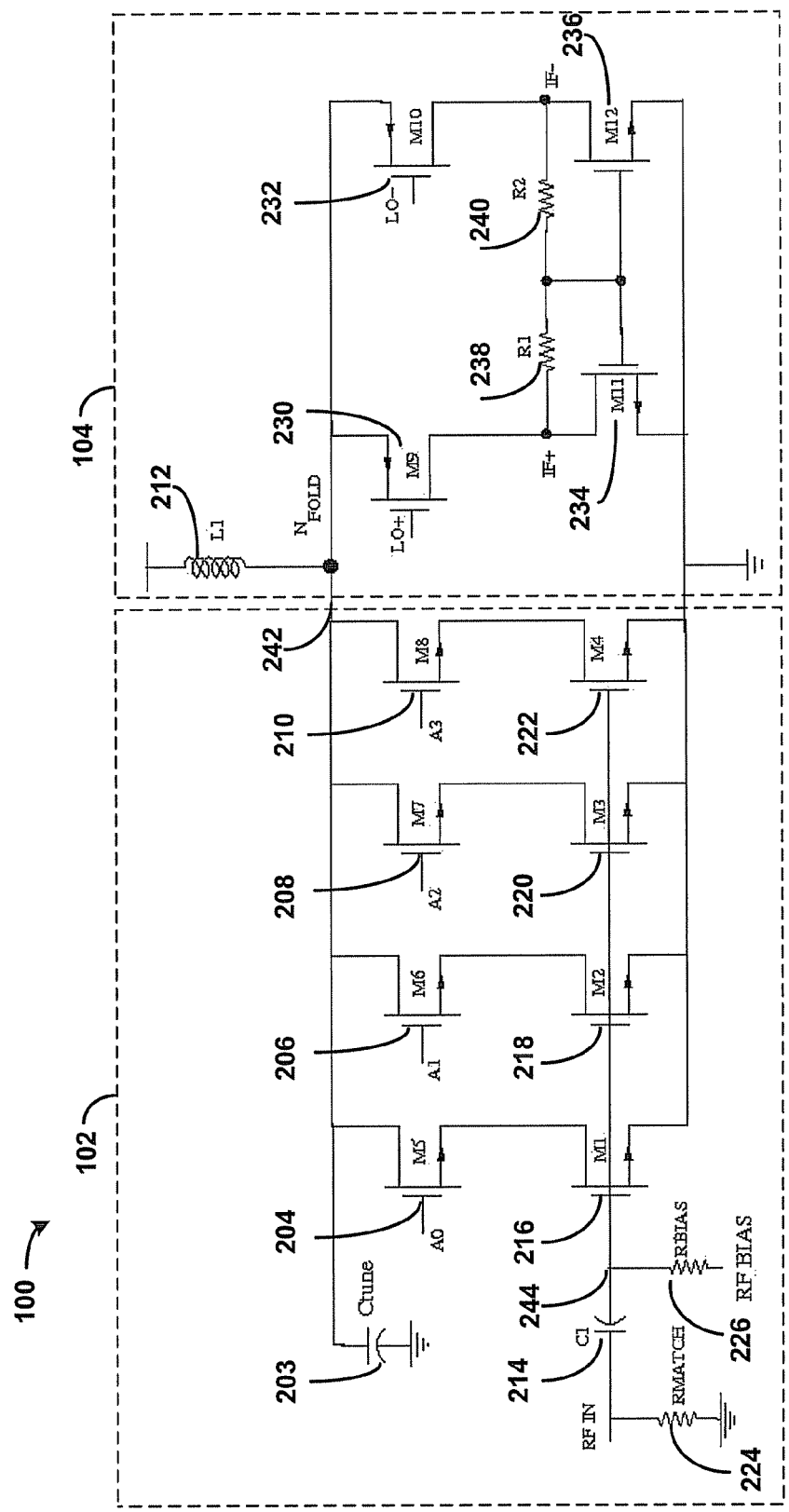
FIG. 2 is a schematic representation of an example folded cascoded low noise amplifier and mixer circuit of FIG. 1 with resistive input matching and low supply voltage operation.

FIG. 2 is a schematic representation of the circuit 100 that includes the low noise amplifier (LNA) 102 coupled to the mixer 104, in accordance with the present disclosure. The low noise amplifier 102 is in the configuration of a folded cascoded LNA, and the circuit 200 includes resistive input matching and low supply voltage operation that has noise figure and linearity adjustability. The cascoded low noise amplifier 102 includes nodes 242 and 244, capacitors 203 and 214, resistors 224 and 226, and n-type transistors 204, 206, 208, 210, 216, 218, 220, and 222. The mixer 104 includes the node 242, an inductor 212, p-type transistors 230 and 232, resistors 238 and 240, and n-type transistors 234 and 236.

In the low noise amplifier 102 of FIG. 2, the drains of n-type transistors 204, 206, 208, and 210 share a common node 242. Node 242 is coupled to ground by capacitor 203 and coupled to a supply voltage by inductor 212. The sources of n-type transistors 204, 206, 208, and 210 are coupled to the drains of n-type transistors 216, 218, 220 and 222, respectively. The sources of n-type transistors 216, 218, 220 and 222 are each coupled to ground. The gates of n-type transistors 204, 206, 208 and 210 receive control inputs A0, A1, A2, and A3 respectively, while the gates of n-type transistors 216, 218, 220 and 222 are coupled to a common node 244. The common node 244 is coupled to a radio frequency bias (RF-BIAS) voltage by resistor 226, and to an RF input by capacitor 214. An RF input is coupled to ground by resistor 224. N-type transistors 216, 218, 220 and 222 form amplifying transistors in an RF signal path of the low noise amplifier 102.

N-type transistors 204, 206, 208 and 210 in pair with n-type transistors 216, 218, 220 and 222 provide the transistor width tunable aspect of the low noise amplifier 102. The control inputs A0, A1, A2 and A3 turn on or off the transistor pairs of 204 and 216, 206 and 218, 208 and 220, and 210 and 222, respectively, in an individual fashion. For example, if control input A0 is a logic one, then n-type transistor 204 will be turned off, which will also turn off n-type transistor 216. Therefore, the RF signal path through the amplifying n-type transistors 216, 218, 220 and 222 becomes smaller, and less gain will be applied. A total transistor width of the amplifying transistors in the RF signal path is accordingly a sum of the widths of the n-type transistors 216, 218, 220 and 222 that are in an on state. As such, the control inputs A0, A1, A2 and A3 are inputs controlling the transistor width.

Thus, a gate voltage of Vdd on any of transistors 204, 206, 208 or 210 turns on the corresponding segment of transistors 216, 218, 220 and 222, respectively, while a gate voltage of zero turns off the corresponding segment of transistors 216, 218, 220 and 222. The total width of the amplifying transistors 216, 218, 220 and 222 in the RF signal path is the sum of widths of the transistors 216, 218, 220 and 222 that are on. The digital control signals A0-3 implement the width tuning capability, for example.

In addition to the control of the transistor width, the illustrative embodiment of FIG. 2 has an independent input, RFBIAS, to control the total bias current. The voltage drop from the RFBIAS voltage to the common node 244 across the resistor 226 controls a total bias current running through the low noise amplifier 102. Thus, the RFBIAS voltage is an input for tuning the bias current. The linearity and noise of the low noise amplifier 102 can be achieved by tuning a desired transistor width with inputs A0, A1, A2 and A3 and separately tuning the bias current with input RFBIAS. For example, by tuning the transistor width, more or less gain can be applied, which enables control of the gain for high linearity and a selectively amplified signal to increase an SNR of the signal.

In the mixer 104 portion of the receiver circuit 200 of FIG. 2, the sources of p-type transistors 230 and 232 share the node 242 and are coupled to the supply voltage by the inductor 212. The drains of p-type transistors 230 and 232 are coupled to the drains of the n-type transistors 234 and 236 respectively. The sources of p-type transistors 234 and 236 are coupled to ground, and the gates of n-type transistor 234 and 235 are coupled to each other. The drain of n-type transistor 234 is coupled to its gate by resistor 238, while the drain of n-type transistor 236 is coupled to its gate by resistor 240. The configuration of the mixer 104 in FIG. 2 forms a folded mixer circuit. Inductor 212 then connects node 242 to the supply voltage. The inductor 212 may, for example, provide low DC drop and/or high impedance at RF frequencies while managing capacitance at node 242 for high gain and improved bandwidth. Alternatively, a n-type transistor connecting the node 242 to the supply voltage may be used. The n-type transistor of high impedance may be used in order to achieve high gain and have a voltage drop greater than a transistor saturation voltage across the n-type transistor. P-type transistors 230 and 232 are switching transistors, while transistors 234 and 236, and resistors 238 and 240 form output load for the mixer 104. Mixer 104 can down-convert the frequency of the input signal. The mixer 104 receives an amplified signal from the low noise amplifier 102 at node 242. The amplified signal at node 242 is multiplied by a square wave generated by the transistors 230 and 232 having oscillating LO+ and LO− inputs at their respective gates to down-convert the amplified signal. The frequency down-converted signal is outputted at the drains of n-type transistors 234 and 236 as the intermediate frequency outputs IF+ and IF− respectively.

Figure 3:
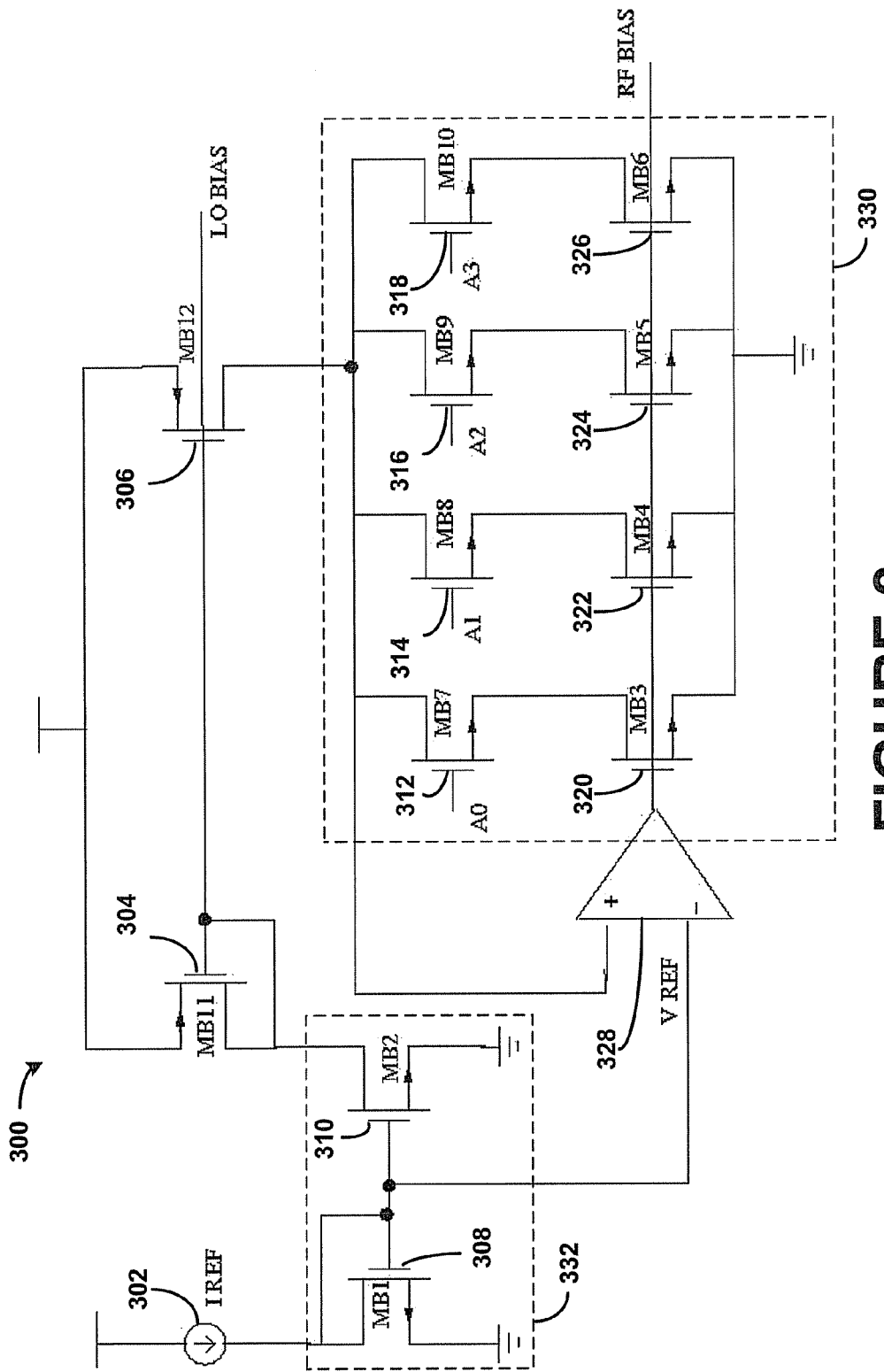
FIG. 3 is a schematic representation of an example bias generation circuit for resistive input matching with a folded cascaded low noise amplifier circuit such as shown in FIG. 2.

FIG. 3 is a schematic representation of an example bias generation circuit 300 for providing the RFBIAS input signal, in accordance with the present disclosure. The circuit 300 is configured for resistive input matching with a folded cascaded low noise amplifier circuit that has noise figure and linearity adjustability, such as the low noise amplifier illustrated in FIG. 2. The bias generation circuit 300 can be operated to generate the RF BIAS that is input to the low noise amplifier to control the bias current.

The bias generation circuit 300 comprises a reference current source 302, a buffer op-amp 328, p-type transistors 304 and 306, and n-type transistors 308, 310, 312, 314, 316, 318, 320, 322, 324, and 326. The sources of p-type transistors 304 and 306 are coupled to the supply voltage. The gates of p-type transistors 304 and 306 and the drains of p-type transistor 304 and n-type transistor 310 share a common node, and provide the LO BIAS output. The reference current source 302, the drain of n-type transistor 308, the negative input of the buffer op-amp 328, and the gates of n-type transistors 308 and 310 all share a common node. The positive input of the buffer op-amp 328, and the drains of p-type transistor 306 and n-type transistors 312, 314, 316, and 318 share a common node. The gates of n-type transistors 312, 314, 316, and 318 receive control inputs A0, A1, A2, and A3, respectively. The control inputs A0, A1, A2, and A3 are the same control inputs as discussed with reference to the receiver circuit 200 illustrated in FIG. 2. The sources of n-type transistors 312, 314, 316, and 318 are coupled with the drains of n-type transistors 320, 322, 324, and 326 respectively, while the sources of n-type transistors 320, 322, 324, and 326 are each coupled to ground. The output of the buffer op-amp 328 and the gates of n-type transistors 320, 322, 324, and 326 share a node and provide the RF BIAS output.

The bias generation circuit 300 contains a mimic circuit 330 such that the configuration of n-type transistors 312, 314, 316, 318, 320, 322, 324, and 326 mimics the configuration of n-type transistors 204, 206, 208, 210, 216, 218, 220, and 222 in the circuit 200, with gates of n-type transistor 312, 314, 316, and 318 receiving the same A0, A1, A2, and A3 inputs as the gates of n-type transistors 204, 206, 208, and 210. The structure of the mimic circuit 330 can be scaled down in size to reduce power consumption. Note that the consistency of transistor sizes between the low noise amplifier and mixer circuit 200 in FIG. 2 and the mimic circuit 330 in FIG. 3 can ensure that the voltages derived from the mimic circuit are effective in the actual circuit.

The transistor width and the bias-current tuning are independent of each other. An effective width of the input transistor is controlled by the digital bits A0-A3 (as referred to in FIG. 2). The bias current through the LNA structure is controlled by the reference current IREF (e.g., element 302 in FIG. 3) and the current mirror formed by the PMOS transistors 304 and 306 as illustrated in FIG. 3.

P-type transistors 304 and 306, and n-type transistors 308 and 310 form a current mirror 332 to isolate current going through the mimic circuit 330 from the current entering the receiver circuit 200 when the bias generation circuit 300 is connected to the circuit 200. The combination of the mimic circuit 330 and the current mirror 332 ensure that a proper bias voltage RFBIAS is provided to the receiver circuit 200 for a given bias current from the reference current source 302 and transistor width inputs A0-A3.

Furthermore, by including a mimic of the circuitry in the bias generation circuit 300 as that in the circuit 200 of FIG. 2, the bias generation circuit 300 will provide control of bias current tuning independent of the width tuning. For example, because the bias generation circuit 300 contains a mimic of the segmented transistors in the circuit 200 (but scaled down in size, for example) the same segments of transistors are turned ON and OFF in the bias generation circuit 300 as in the circuit 200. This ensures a proper bias voltage RFBIAS for any given bias current of IREF and width control setting of A0-3, for example.

Figure 4:
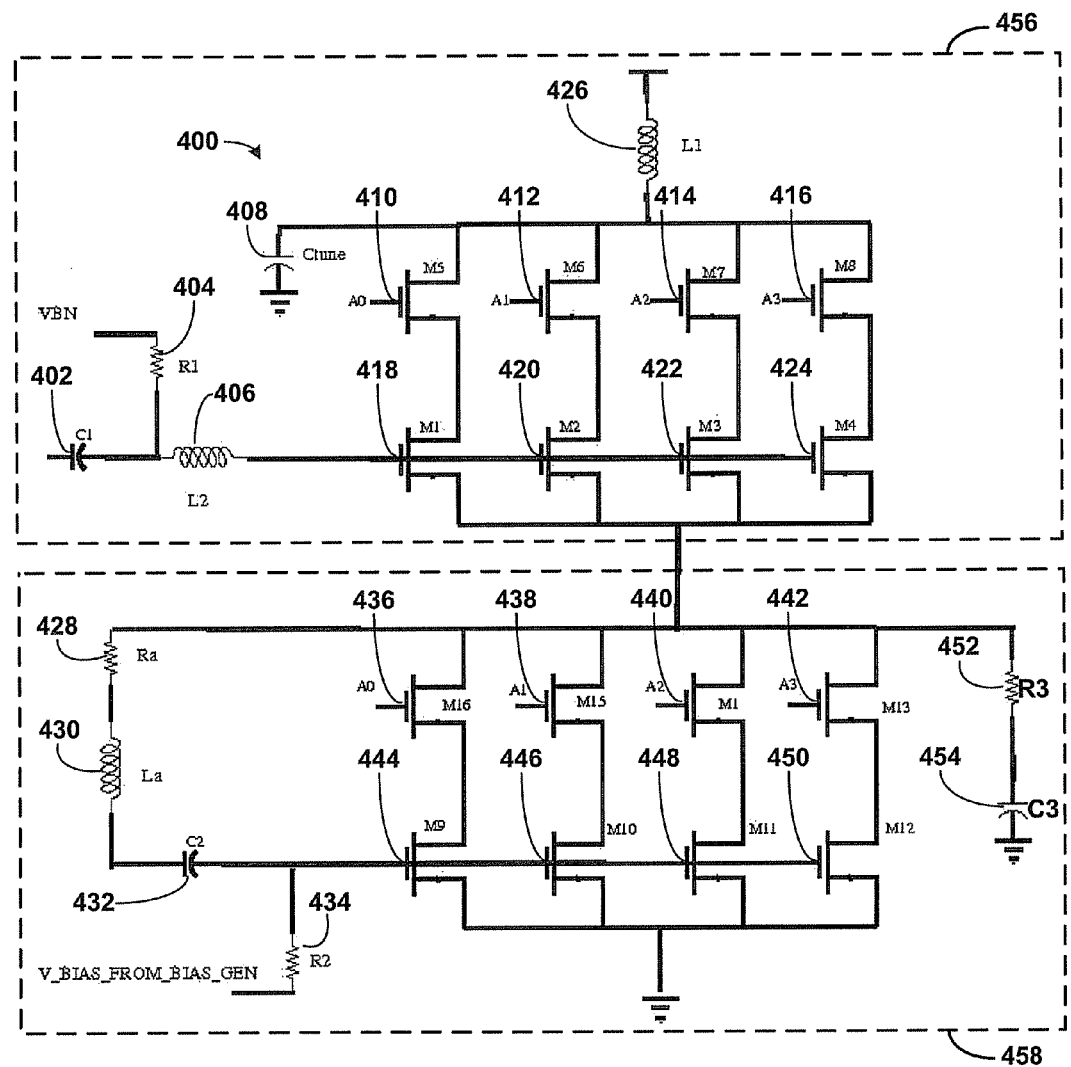
FIG. 4 is a schematic representation of an example impedance matched inductive source degenerated low noise amplifier circuit that may be utilized in the circuit of FIG. 1.

FIG. 4 is a schematic representation of another example low noise amplifier 400, in accordance with the present disclosure. The low noise amplifier 400 is configured with an impedance matched inductive source that enables noise figure and linearity adjustability. The circuit 400 is a variation of the receiver circuit 200 illustrated in FIG. 2, and operates in a similar fashion, but with the addition of common source inductive degeneration for less noise than the resistive termination in circuit 200. Similar to the low noise amplifier 201 in FIG. 2, the low noise amplifier 400 receives control inputs A0, A1, A2, and A3, and voltage inputs RF input and RF BIAS, and outputs an amplified RF signal that can be down-converted by a mixer circuit for processing.

The low noise amplifier circuit 400 comprises capacitors 402, 408, 432, and 454; inductors 406, 426, and 430; resistors 404, 428, 434, and 452; and n-type transistors 410, 412, 414, 416, 418, 420, 422, 424, 436, 438, 440, 442, 444, 446, 448 and 450. The drains of n-type transistors 410, 412, 414, and 416 share a common node and are coupled to ground by capacitor 408, and coupled to the supply voltage by inductor 426. The sources of n-type transistors 410, 412, 414, and 416 are coupled to the drains of n-type transistors 418, 420, 422, and 424 respectively. The input voltage VBN is coupled to ground by the resistor 404 and the capacitor 402 in series, and the gates of n-type transistors 418, 420, 422, and 424 are coupled to both the resistor 404 and capacitor 402 by the inductor 406. The sources of n-type transistors 418, 420, 422, and 424, and the drains of n-type transistors 436, 438, 440, and 442 all share a common node that is coupled to ground by resistor 452 and capacitor 454 in series, and coupled to the gates of n-type transistors 444, 446, 448, and 450 by resistor 428, inductor 430, and capacitor 432 in series. The sources of n-type transistors 436, 438, 440 and 442 are coupled to the drains of n-type transistors 444, 446, 448, and 450 respectively, while the sources of n-type transistors 444, 446, 448, and 450 are coupled to ground. The gates of n-type transistors 444, 446, 448, and 450 are also coupled to a bias voltage from a bias generation circuit 500 by resistor 434. The bias voltage is the result of a bias current running through the resistor 434. The gates of n-type transistors 410 and 436, 412 and 438, 414 and 440, and 416 and 442 each receive control inputs A0, A1, A2, and A3, respectively. The bias current may be provided by the bias generation circuit 300, for example, and can also be tuned by the input voltage VBN.

The circuit 400 may lower noise restrictions by including inductive degeneration with inductors tuned to maintain impedance matching, for example. The n-type transistors 410, 412, 414, 416, 418, 420, 422, and 424 comprise a first inductive circuit 456, and the n-type transistors 436, 438, 440, 442, 444, 446, 448 and 450 comprise a second inductive circuit. Adjusting a gain of the transistors affects an input impedance of the first inductive circuit 456 and the second inductive circuit 458, respectively.

An output of the circuit 400 is the drain terminal of NMOS transistors (410-416), which is also connected to the inductor (L1) 426 and a top node of the capacitor Ctune 408.

Figure 5:
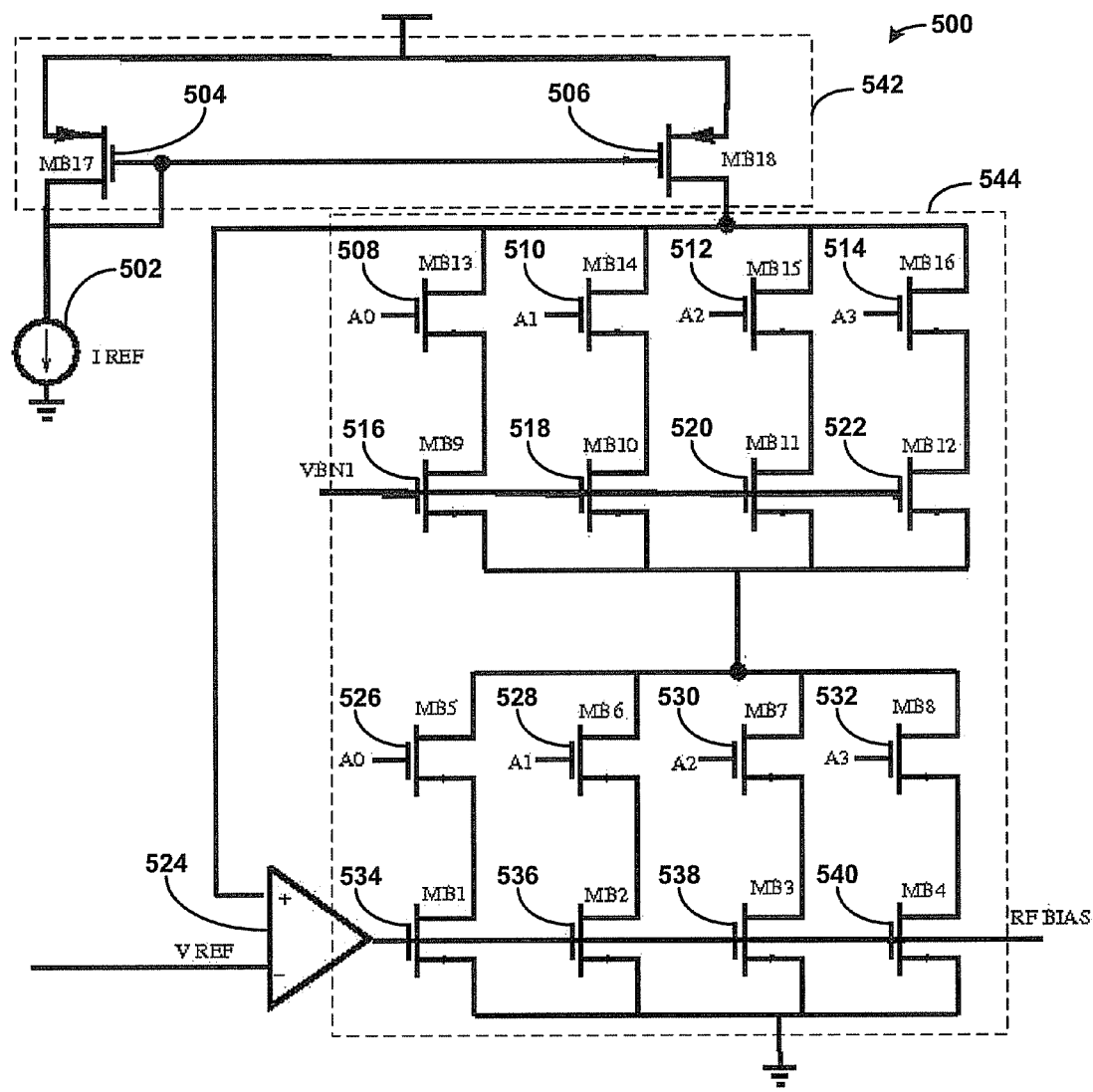
FIG. 5 is a schematic representation of an example bias generation circuit for an impedance matched inductive source degenerated low noise amplifier that may also be utilized in FIG. 1.

FIG. 5 is a schematic representation of an example of another bias generation circuit 500. The bias generation circuit 500 is configured for an impedance matched inductive source degenerated low noise amplifier. Bias generation circuit 500 is a variation of the bias generation circuit 300, and operates in a similar fashion, but with a mimic circuit 544 modeled after the low noise amplifier circuit 400

The bias generation circuit 500 comprises a reference current source 502, a buffer op-amp 524, p-type transistors 504 and 506, and n-type transistors 508, 510, 512, 514, 516, 518, 520, 522, 526, 528, 530, 532, 534, 536, 538, and 540. The sources of p-type transistors 504 and 506 are coupled to the supply voltage. The gates of the p-type transistors 504 and 506 are coupled to the drain of p-type transistor 504 and the reference current source 502. The drain of p-type transistor 506, the positive input of the buffer op-amp 524, and the drains of n-type transistors 508, 510, 512, and 514 share the same node. The sources of n-type transistors 508, 510, 512, 514 are coupled to the drains of n-type transistors 516, 518, 520, and 522 respectively, while the sources of n-type transistors 516, 518, 520, and 522 and the drains of n-type transistors 526, 528, 530, and 532 share a common node. The gates of n-type transistors 516, 518, 520, and 522 receive the input voltage VBN. The sources of n-type transistors 526, 528, 530, and 532 are coupled to the drains of n-type transistors 534, 536, 538, and 540, and the sources of n-type transistors 534, 536, 538, and 540 are coupled to ground. The gates of n-type transistors 534, 536, 538, and 540 receive the output of the buffer op-amp 524. The gates of n-type transistors 508 and 526, 510 and 528, 512 and 530, and 514 and 532 are coupled with the control inputs A0, A1, A2, and A3 respectively.

In an embodiment, the bias generation circuit 500 comprises a current mirror 542 and a mimic circuit 544. These two portions in combination enable a proper bias voltage to be provided to the low noise amplifier circuit 400 for a given bias current from the current source 502 and transistor width input. Similar to the case of bias generation circuit 300, the structure of the mimic circuit 544 can also be scaled down in size to reduce power consumption.

Any reference voltage that does not change due to the transistor width tuning control bits can be used as the VREF input of the op-amp 524. For example, a band-gap voltage can be used as VREF. The VREF should be sufficiently high to maintain the transistors 516, 518, 526, 528, 530, 532, 538, and 540 in saturation and sufficiently low to keep the transistor 522 in saturation.

As discussed above, the low noise amplifier circuit 400 is a variation of the cascoded low noise amplifier 102 illustrated in FIG. 2, but with the addition of common source inductive degeneration. In an illustrated embodiment, the input impedance of a low noise amplifier attempts to match a 50Ω source impedance, for example, to maximize power transfer and minimizes reflections. In the inductively degenerated low noise amplifier 400, a real component of the input impedance is a function of the transconductance of the input transistors 418, 420, 422, and 424, and an imaginary component of the input impedance is tuned out with the series inductor 406. The effective transconductance of the input n-type transistors 418, 420, 422, and 424 varies according to the transistor selection and bias current inputs. This may result in a variable real component of the input impedance of the LNA. To keep the real component of the input impedance constant, a degenerating inductor can be implemented as an active inductor structure. An example of such an inductor is shown in FIG. 6.

Figure 6:
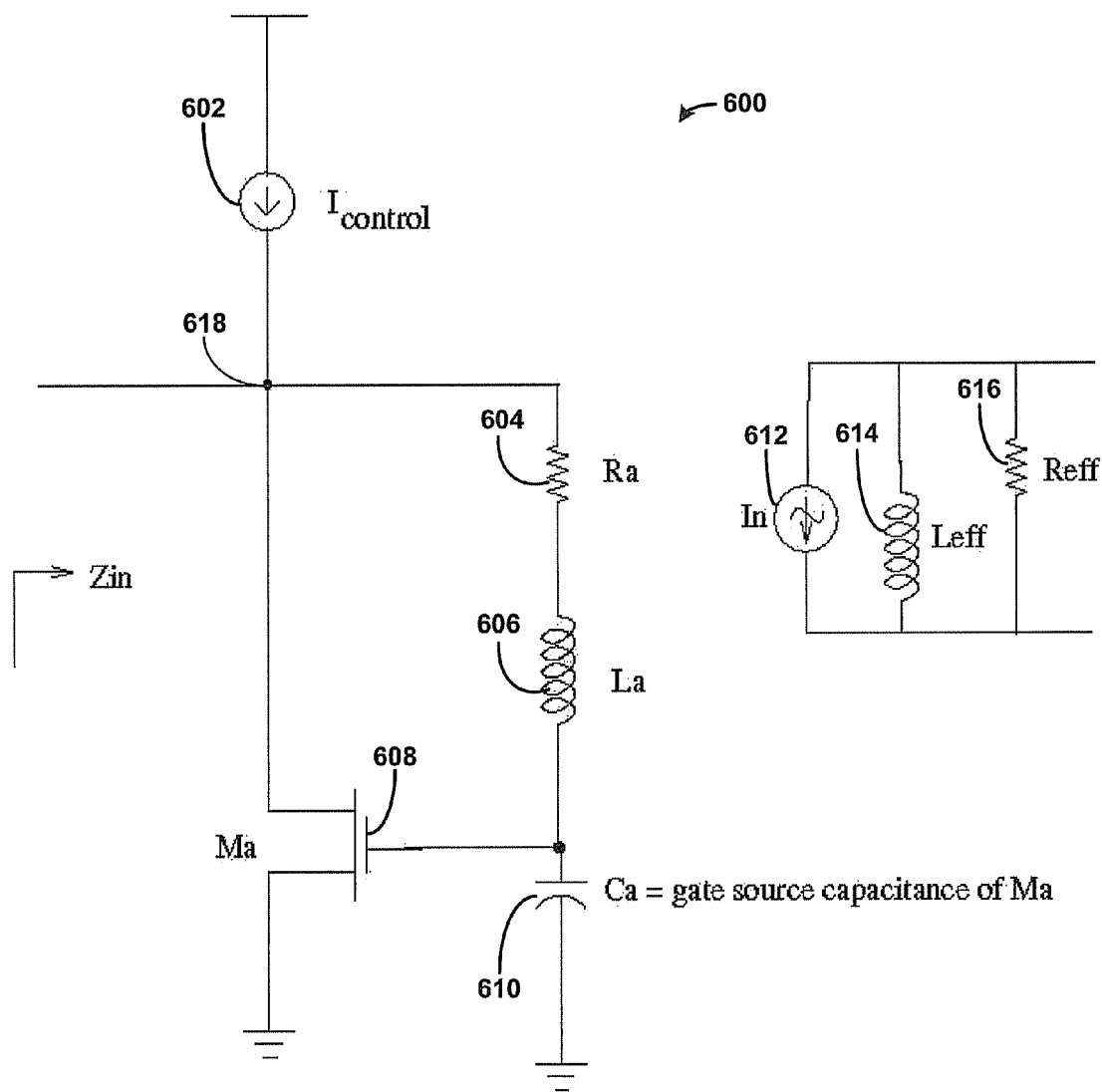
FIG. 6 is a schematic representation of a simplified impedance matching circuit such as shown in FIG. 4.

FIG. 6 illustrates an example simplified circuit model 600 that shows how to acquire the adjustable inductor circuit design values for resistor 428, inductor 430, and n-type transistors 444, 446, 448, and 450 in the low noise amplifier circuit 400 of FIG. 4. An effective inductance looking into the cascoded n-type transistors 436, 438, 440, 442, 444, 446, 448, and 450 needs to be adjusted according to the gain provided in the combination of cascoded n-type transistors 410, 412, 414, 416, 418, 420, 422, and 424. This can be achieved by adjusting a gain of n-type transistors 444, 446, 448, and 450.

The simplified circuit model 600 comprises a control current source 602, a resistor 604, a passive inductor 606, a gate source capacitance 610, a transistor 608, and an input node 618. The transistor 608 is a simplified representation of the n-type transistors 444, 446, 448, and 450 in the circuit 400. Thus, the transistor 608 models an effective transistor width of the transistors that are switched on among the transistors (e.g., among transistors 444, 446, 448, 450).

An active inductor implementation uses the passive inductor 606 and resistor 604 in series, coupled to ground by both the gate source capacitance 610 and the gate of the transistor 608. Thus, the resistor 604 models the resistance 428. The capacitor $C_{gsa}$ 610 also models an effective capacitance from the common gate terminal of the transistors 444, 446, 448, and 450. Similarly, the inductor 606 models the inductor 428.

The inductor 606 is made to resonate with a gate source capacitance 610 of the transistor 608 at a desired frequency band of a low noise amplifier circuit. The effective inductance offered by the circuit looking into the node 618 at a resonant frequency (also a frequency of operation of the LNA) is given by:

$$L_{eff} = \frac{R_a C_{gsa}}{gm_a}$$

where $L_{eff}$ is an inductance value of the inductor 606, $R_a$ is a resistance value of the resistor 604, $C_{gsa}$ is a capacitance value of the capacitance 610, and $g_{ma}$ is a gain value of the transistor 608.

A real component of the input impedance looking into the circuit model 600 at node 618 can be held constant by designing a transconductances of the transistor 608 in circuit 600 to track transconductance of input n-type transistors 418, 420, 422, and 424 in the circuit 400. This can be achieved by segmenting the transistors 444, 446, 448, and 450 of the circuit 400.

The inductor 606 is tuned by tuning the sum of all transconductances of the transistors that are switched on among the transistors 444, 446, 448, and 450. A number of switched on transistors is in turn controlled by the digital bits A0-A3 in as illustrated in FIG. 4.

Segmentation can be achieved by having parallel copies of a small sized transistor. Each copy is called a segment, with each being independently turned on or off, thus allowing an operating transistor width to be adjustable (e.g., as implemented in the circuit 200 and the circuit 400). As such, the current through n-type transistors 418, 420, 422, and 424 and the current through n-type transistors 444, 446, 448, and 450 are the same. This results in a transconductance of the transistor 608 in circuit model 600, which is the simplified representation of the n-type transistors 444, 446, 448, and 450 in the circuit 400, tracking transconductances of the input n-type transistors 418, 420, 422, and 424 in the circuit 400.

Possible values for the degeneration inductance impedance matching circuit model 600 can be 1.5 nH for the inductor 606, 10 nH for the series inductor 406, and transistor 608 having gate to source capacitance of 400 fF. The transistors 418, 420, 422, and 424 in the circuit 400, represented by transistor 608 in the circuit 600 can be NMOS RF-CMOS transistors, or any type of MOSFET. Note that when degeneration inductance of the segmented transistors 418, 420, 422, and 424 is changed along with transconductances of those respective transistors in the circuit 400, an imaginary component of the input impedance looking into the segmented transistors may also change accordingly. Due to the relatively low degenerative inductance of the segmented transistors 418, 420, 422, and 424 in comparison to the value of inductor 406, the input impedance matching of the low noise amplifier 400 typically remains acceptable at an input reflection coefficient greater than −10 dB.

Figure 7:
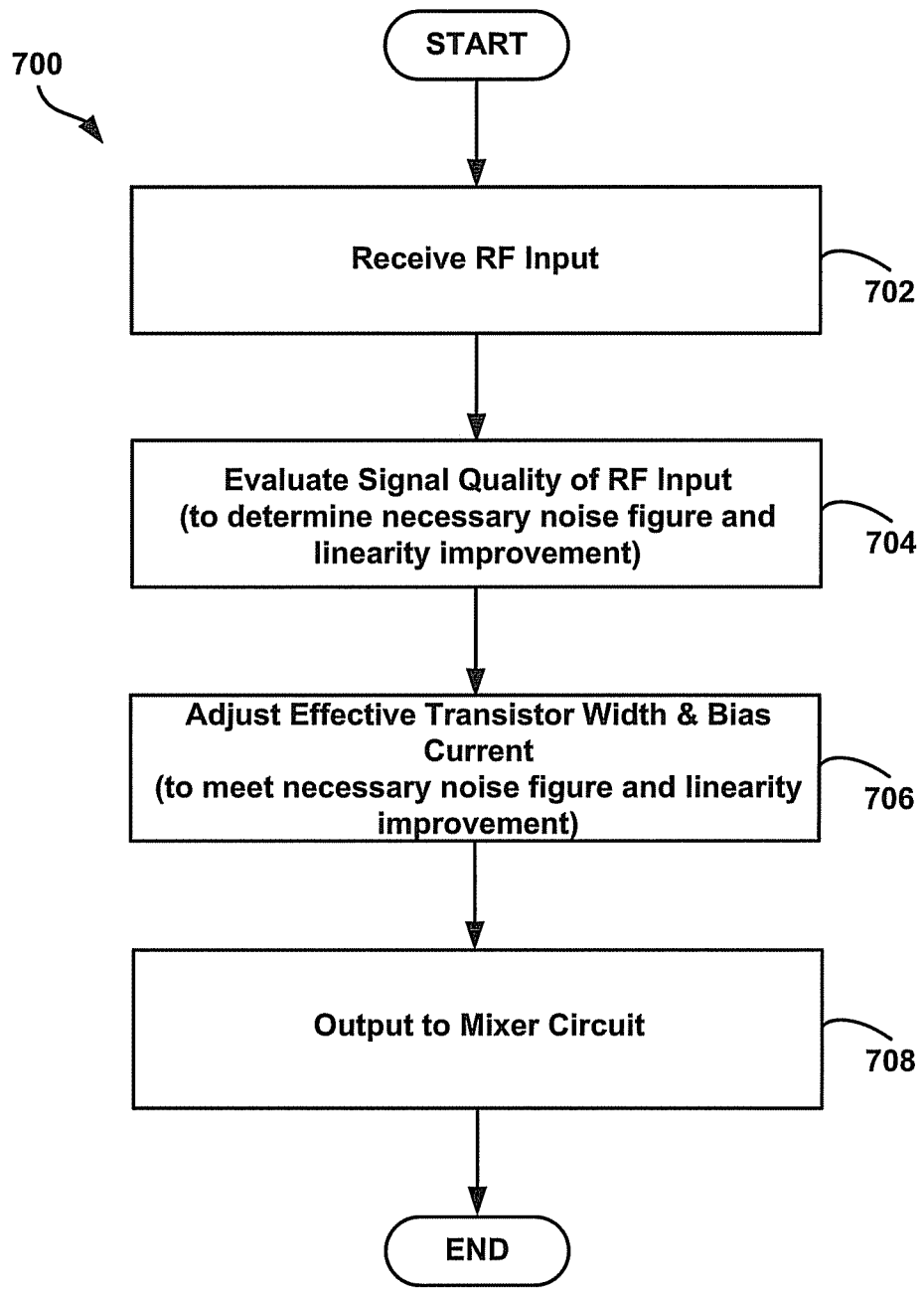
FIG. 7 illustrates an example flowchart including example functional steps for adjusting operating characteristics of a receiver utilizing the circuit of FIG. 1.

Implementing examples of low noise amplifiers and mixer circuits discussed above, a receiver can have operating characteristics altered during times of low noise or low interference situations, and the receiver can thus operate on less power. FIG. 7 illustrates an example flowchart including functional steps 700 for adjusting operating characteristics of a receiver. It should be understood that the flowchart shows the functionality and operation of one possible implementation of example embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. In addition, each block may represent circuitry that is wired to perform the specific logical functions in the process. Alternative implementations are included within the scope of the example embodiments of the present application in which functions may be executed out of order from that shown or discussed, including substantially concurrent or in reverse order, depending on the functionality involved, as would be understood by those reasonably skilled in the art.

Initially, as shown at block 702, an RF input is received. The RF input may be received via an antenna coupled to a receiver. After the RF input is received, the RF signal is evaluated to determine a desired gain and SNR improvement for proper signal processing, as shown at block 704. Evaluation of the RF signal can involve measuring the SNR of the input RF signal at the antenna, and determining the desired gain necessary to acquire a signal having an SNR that meets the signal processing requirements of the receiver signal processor. The sufficient SNR required for the receiver signal processor will depend on the signal processors used and the nature of receiver application.

The SNR of a signal can be determined by comparing the power of noise within received information to the power of the signal within the received information. If the signal is difficult to discern from the noise, then the SNR is poor and the noise figure/gain can be increased to improve the SNR, for example.

After the evaluation, bias current and transistor width parameters are provided to the receiver circuit, as shown at block 706. For example, control inputs can be provided to transistors within the receiver to determine which and how many transistors are on. By adjusting the current and transistor width parameters, a gain of the receiver is adjusted accordingly. The RF input is then output to a mixer circuit for frequency down-conversion, as shown at block 708. The mixer circuit down-converts the frequency of the RF input to a signal having the appropriate frequency of the receiver signal processing unit.

In an alternative embodiment, the evaluate signal quality step 704, and the adjustment of the effective transistor width and bias current step 706 can be performed continuously or periodically to provide consistent power optimized signal processing. For example, the bias current and transistor width can be altered to adjust a gain, and then the RF input will be processed by the receiver. The RF input can be analyzed to determine if the signal quality and noise figures are within an acceptable range of values. If the signal quality or noise figures are not within the acceptable range, the bias current and the transistor width can be adjusted again, and the RF input can be passed through the receiver circuit again for additional processing.

Table 1 below indicates example linearity and noise figure measurements, and associated changes that can be made to the bias current and transistor width inputs to improve the linearity and noise figures of the amplifier. For example, if the measured linearity and noise figure are each high (compared to acceptable or desired values that vary based on type of receiver and an application of the receiver), then a bias current can be decreased to lower the noise figure, and no change may be needed to the transistor widths (because the linearity is already acceptable), for example. However, as shown in row 2, if the linearity value is low, the transistor width inputs can be increased to increase a gain of the receiver, for example, to improve the linearity. Optimal bias current inputs and transistor width inputs may be obtained when the linearity is high and the noise figure is low, for example.

TABLE 1

| Linearity | Noise Figure | Bias Current | Transistor Width |
|---|---|---|---|
| High | High | decrease | No Change |
| Low | High | decrease | decrease |

TABLE 1-continued

| Linearity | Noise Figure | Bias Current | Transistor Width |
|---|---|---|---|
| High | Low | increase | increase |
| Low | Low | increase | No Change |

Figure 8:
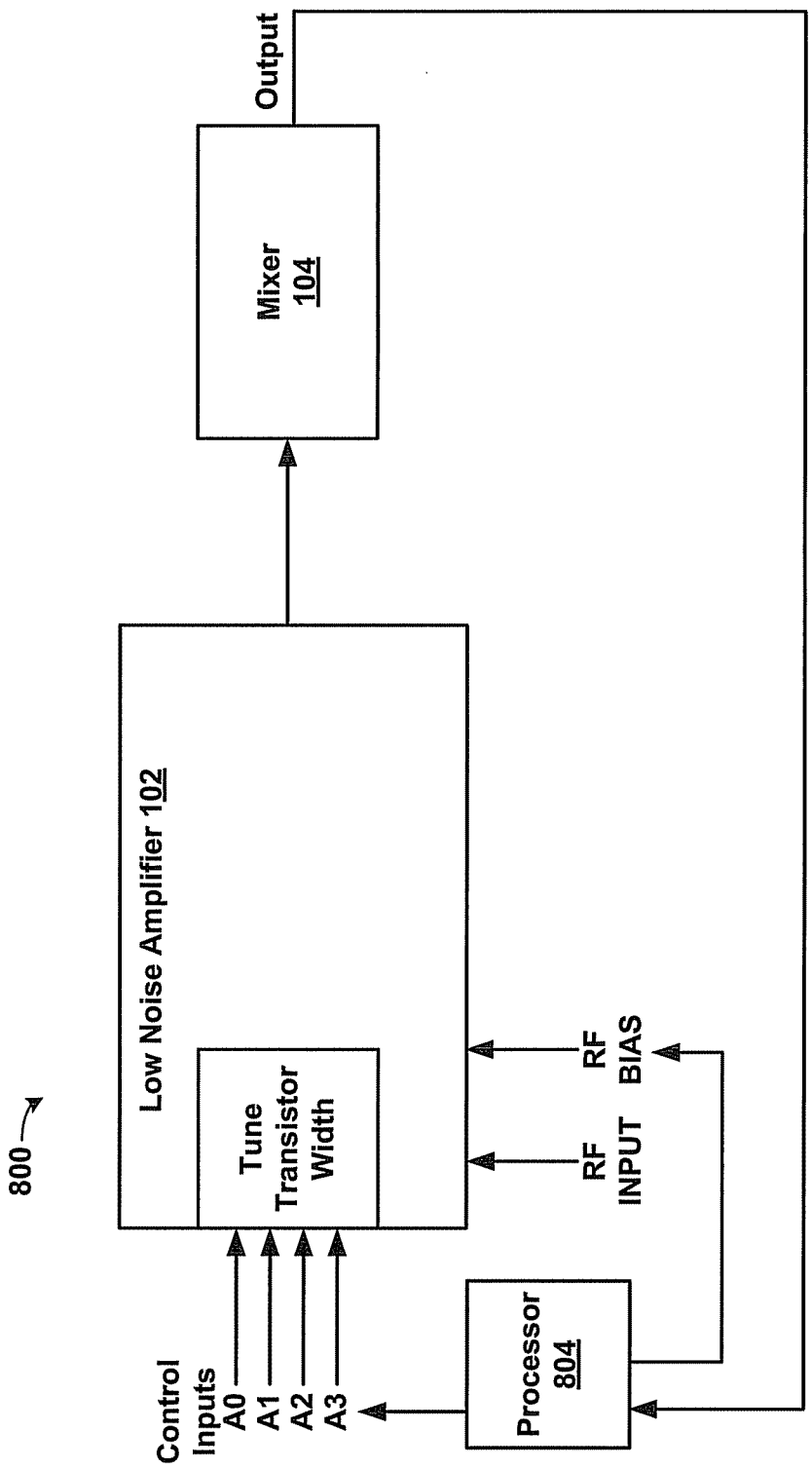
FIG. 8 illustrates an example receiver circuit for continuously or periodically evaluating RF input signals and adapting control inputs to a low noise amplifier such as shown in FIG. 2.

An example receiver circuit 800 is shown in FIG. 8 for continuously or periodically evaluating RF input signals and adapting control inputs to a low noise amplifier 102 accordingly. The receiver 800 includes the low noise amplifier 102 that receives an RF Input and an RF BIAS voltage, and control inputs A0, A1, A2, and A3. The control inputs will adjust a width of gain transistors in the low noise amplifiers. A processor 804 may be programmed to analyze a SNR value and noise figure of the RF input. Based on the analysis of the RF Input by the processor 804, the processor 804 will output the appropriate control inputs A0, A1, A2, A3, and RF BIAS to the low noise amplifier 102. The RF input will be processed by the gain transistors according to the control inputs determined by the processor 804 and sent to a mixer 104 for down-conversion. This process can be performed continuously or periodically to ensure that power optimized control inputs A0, A1, A2, A3 and RF BIAS are used for the present RF Input.

Figure 9:
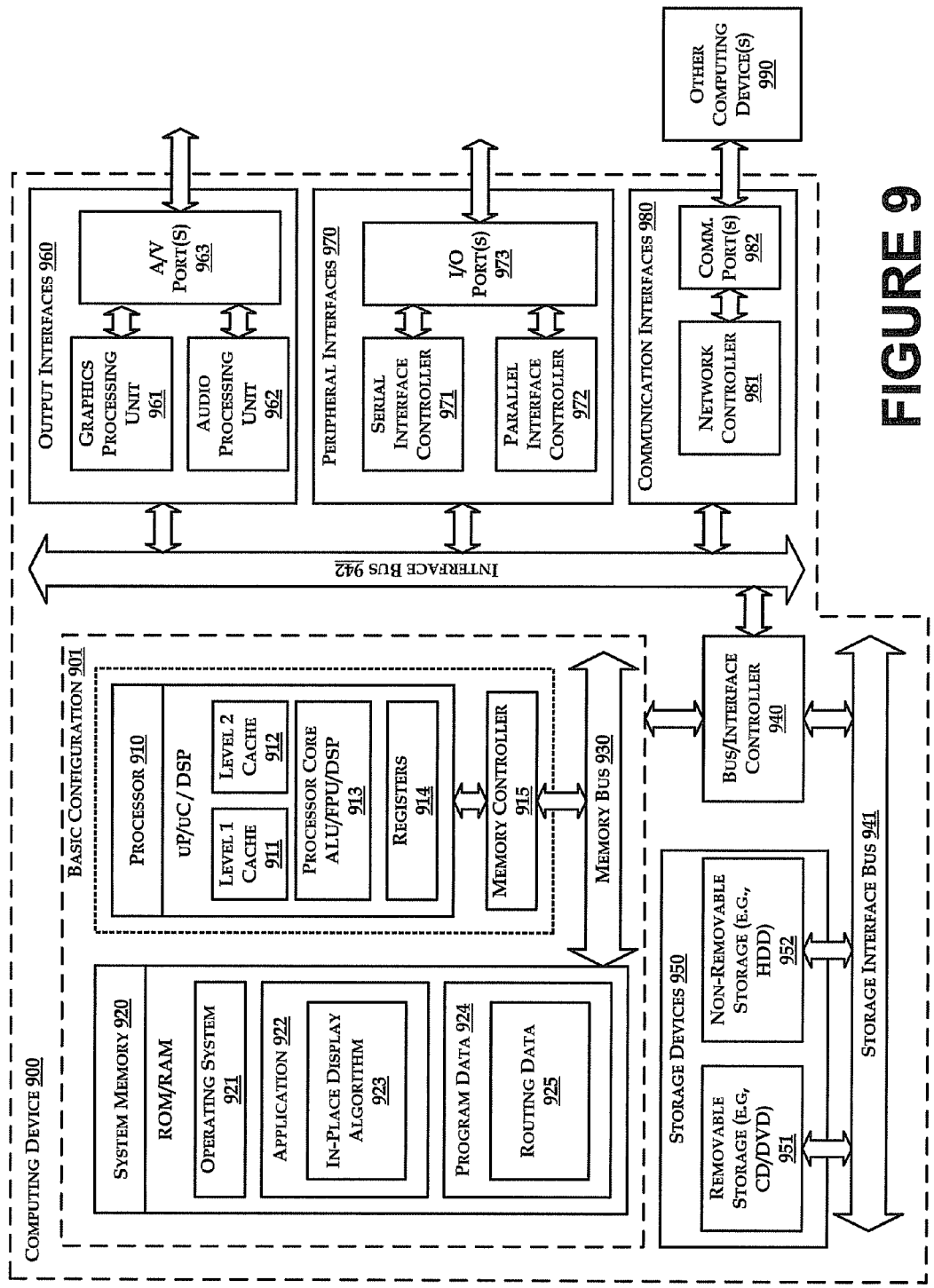
FIG. 9 illustrates an example computing device that is arranged for implementing the method of FIG. 7.

FIG. 9 is a block diagram illustrating an example computing device 900 that is arranged for controlling the adaptive LNA and mixer circuits, in accordance with the present disclosure. In a very basic configuration 901, computing device 900 typically includes one or more processors 910 and system memory 920. A memory bus 930 can be used for communicating between the processor 910 and the system memory 920.

Depending on the desired configuration, processor 910 can be of any type including but not limited to a microprocessor ($\mu$P), a microcontroller ($\mu$C), a digital signal processor (DSP), or any combination thereof. Processor 910 can include one more levels of caching, such as a level one cache 911 and a level two cache 912, a processor core 913, and registers 914. The processor core 913 can include an arithmetic logic unit (ALU), a floating point unit (FPU), a digital signal processing core (DSP Core), or any combination thereof. A memory controller 915 can also be used with the processor 910, or in some implementations the memory controller 915 can be an internal part of the processor 910.

Depending on the desired configuration, the system memory 920 can be of any type including but not limited to volatile memory (such as RAM), non-volatile memory (such as ROM, flash memory, etc.) or any combination thereof. System memory 920 typically includes an operating system 921, one or more applications 922, and program data 924. Application 922 includes control input processing algorithm 923 that is arranged to provide inputs to an adaptive LNA and mixer circuits, in accordance with the present disclosure. Program Data 924 includes control input data 925 that is useful for minimizing power consumption of the receiver circuit, as will be further described below. In some example embodiments, application 922 can be arranged to operate with program data 924 on an operating system 921 such that power consumption by a receiver circuit is minimized. This described basic configuration is illustrated in FIG. 9 by those components within dashed line 901.

Computing device 900 can have additional features or functionality, and additional interfaces to facilitate communications between the basic configuration 901 and any required devices and interfaces. For example, a bus/interface controller 940 can be used to facilitate communications between the basic configuration 901 and one or more data storage devices 950 via a storage interface bus 941. The data storage devices 950 can be removable storage devices 951, non-removable storage devices 952, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media can include volatile and nonvolatile, removable and non-removable media implemented in any method or technology for storage of information, such as computer readable instructions, data structures, program modules, or other data.

System memory 920, removable storage 951 and non-removable storage 952 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 900. Any such computer storage media can be part of device 900.

Computing device 900 can also include an interface bus 942 for facilitating communication from various interface devices (e.g., output interfaces, peripheral interfaces, and communication interfaces) to the basic configuration 901 via the bus/interface controller 940. Example output interfaces 960 include a graphics processing unit 961 and an audio processing unit 962, which can be configured to communicate to various external devices such as a display or speakers via one or more A/V ports 963. Example peripheral interfaces 960 include a serial interface controller 971 or a parallel interface controller 972, which can be configured to communicate with external devices such as input devices (e.g., keyboard, mouse, pen, voice input device, touch input device, etc.) or other peripheral devices (e.g., printer, scanner, etc.) via one or more I/O ports 973. An example communication interface 980 includes a network controller 981, which can be arranged to facilitate communications with one or more other computing devices 990 over a network communication via one or more communication ports 982. The Communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, and not limitation, communication media can include wired media such as a wired network or direct-wired connection, and wireless media such as acoustic, radio frequency (RF), infrared (IR) and other wireless media. The term computer readable media as used herein can include both storage media and communication media.

Computing device 900 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 900 can also be implemented as a personal computer including both laptop computer and non-laptop computer configurations.

In general, it should be understood that the circuits described herein may be implemented in hardware using integrated circuit development technologies, or yet via some other methods, or the combination of hardware and software objects that could be ordered, parameterized, and connected in a software environment to implement different functions described herein. For example, the present application may be implemented using a general purpose or dedicated processor running a software application through volatile or non-volatile memory. Also, the hardware objects could communicate using electrical signals, with states of the signals representing different data.

It should be further understood that this and other arrangements described herein are for purposes of example only. As such, those skilled in the art will appreciate that other arrangements and other elements (e.g. machines, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions, or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A receiver circuit, comprising:
   a plurality of amplifying transistors connected in series, the amplifying transistors effective to amplify an input signal;
   a plurality of control transistors, wherein each of the plurality of control transistors is connected to one of the plurality of amplifying transistors, wherein each control transistor is effective to receive an independent control signal at a gate of the control transistor and effective to output to one of the amplifying transistors so as to provide for independent operation of each of the plurality of amplifying transistors, and wherein a number of the plurality of amplifying transistors in operation corresponds to a transistor width of the receiver circuit; and a bias generation circuit that includes circuitry effective to mimic operation of the plurality of amplifying transistors and the plurality of control transistors, the bias generation circuit includes a first set of transistors with gates and effective to receive the independent control signals at respective gates and a second set of transistors effective to receive an RF reference bias current input and the bias generation circuit effective to output an RF bias control voltage to the plurality of amplifying transistors, the RF bias control voltage corresponding to a value of the transistor width, the first set of transistors being equal in number to the control transistors; and wherein the independent control signals and the RF reference bias current input are independently tunable.

2. The receiver circuit of claim 1, wherein a source of each one of the plurality of control transistors is connected to a drain of one of the plurality of amplifying transistors.

3. The receiver circuit of claim 1, further comprising a mixer circuit coupled to an output of the plurality of amplifying transistors, the mixer circuit effective to down-convert an output signal of the amplifying transistors.

4. The receiver circuit of claim 1, further comprising a processor effective to evaluate an amplified RF input signal to determine whether the amplified RF input signal substantially meets a noise figure and a linearity requirement, and if the amplified RF input signal does not substantially meet the noise figure and the linearity requirement, the processor is effective to readjust the independent control signals or the RF reference bias current input.

5. The receiver circuit of claim 1, further comprising:
a first inductive circuit including the plurality of amplifying transistors and the plurality of control transistors; and
a second inductive circuit including:
a second plurality of amplifying transistors connected in series and effective to receive an output of the first plurality of amplifying transistors; and
a second plurality of control transistors, wherein each of the second plurality of control transistors is connected to one of the second plurality of amplifying transistors, wherein each second control transistor is effective to receive an independent control signal at a gate of the second control transistor and is effective to output to one of the second amplifying transistors so as to provide for independent operation of each of the second plurality of amplifying transistors, and wherein a number of the second plurality of amplifying transistors in operation corresponds to the transistor width of the receiver circuit;
wherein adjustment of a gain of the second plurality of amplifying transistors adjusts an inductance of the first inductive circuit and the second inductive circuit.

6. The receiver circuit of claim 5, wherein the plurality of control transistors and the second plurality of control transistors receive the same independent control signals.

7. The receiver circuit of claim 5, wherein a real component of input impedance to the first inductive circuit is a function of transconductance of the plurality of amplifying transistors and varies based on the transistor width, and wherein an imaginary component of the input impedance is tuned out with an inductor connected in series with the plurality of amplifying transistors.

8. The receiver circuit of claim 7, wherein the input impedance is held substantially constant by adjustment of a transconductance of the second plurality of amplifying transistors to substantially match a transconductance of the plurality of amplifying transistors.

9. The receiver circuit of claim 7, wherein the input impedance is held substantially constant by adjustment of a source degeneration inductance in the same proportion as adjustment of the transistor width of the plurality of amplifying transistors.

10. A method of adjusting operating characteristics of a receiver, the method comprising:
receiving a radio frequency (RF) input signal;
evaluating a signal quality of the RF input signal to determine whether the RF input signal substantially meets a noise figure and linearity requirement;
adjusting a gain of the receiver based on the evaluation of the RF input signal, wherein adjusting the gain of the receiver includes receiving independent control signals at gates of control transistors that each output to one of a plurality of amplifying transistors within the receiver so as to provide for independent operation of each of the plurality of amplifying transistors to control the gain of the receiver, and wherein a number of the plurality of amplifying transistors in operation corresponds to a transistor width of the receiver circuit;
adjusting a bias current based on the transistor width of the receiver circuit and based on the independent control signals, wherein adjusting the bias current includes reception of the independent control signals at respective gates of a first set of transistors, reception of an RF reference bias current input at a second set of transistors, and output of an RF bias control voltage to the plurality of amplifying transistors, wherein the RF bias control voltage corresponds to the value of the transistor width, and wherein the first set of transistors is equal in number to the control transistors;
amplifying the RF input signal using the adjusted gain and adjusted bias current values; and outputting the amplified RF input signal.

11. The method of claim 10, further comprising evaluating the amplified RF input signal to determine whether the amplified RF input signal substantially meets the noise figure and the linearity requirement.

12. The method of claim 11, wherein if the amplified RF input signal does not substantially meet the noise figure and the linearity requirement, the method further comprising readjusting the gain of the receiver or the bias current.

13. The method of claim 11, further comprising down-converting the amplified RF input signal.

14. The method of claim 10, wherein adjusting the bias current comprises mimicking operation of the plurality of amplifying transistors and the control transistors to provide the transistor width of the receiver circuit.

15. The method of claim 10, wherein adjusting the bias current comprises:
receiving the independent control signals at gates of second control transistors that each output to one of a plurality of second amplifying transistors within the receiver so as to provide for independent operation of each of the plurality of second amplifying transistors;
receiving an RF reference current at the plurality of second amplifying transistors; and outputting the bias current from the plurality of second amplifying transistors to the plurality of amplifying transistors.

16. The method of claim 10, wherein adjusting the bias current comprises adjusting the bias currently based on a transistor width of a mimic circuit that mimics the receiver circuit.

17. The method of claim 10, wherein adjusting the gain of the receiver comprises adjusting an inductance of a first inductive circuit and a second inductive circuit,
wherein the first inductive circuit comprises the plurality of amplifying transistors and the plurality of control transistors; and
wherein the second inductive circuit comprises a second plurality of amplifying transistors connected in series and receiving an output of the first plurality of amplifying transistors, and a second plurality of control transistors, wherein each of the second plurality of control transistors is connected to one of the second plurality of amplifying transistors, wherein each second control transistor receives an independent control signal at a gate of the second control transistor and outputs to one of the second amplifying transistors so as to provide for independent operation of each of the second plurality of amplifying transistors, and wherein a number of the second plurality of amplifying transistors in operation corresponds to the transistor width of the receiver circuit.

18. An inductively degenerated low noise signal amplifier, comprising:
a first inductive circuit including:
a first plurality of amplifying transistors connected in series and effective to amplify an input signal; and
a first plurality of control transistors, wherein each of the first plurality of control transistors is connected to one of the first plurality of amplifying transistors, wherein each first control transistor is effective to receive an independent control signal at a gate of the first control transistor and effective to output to one of the first amplifying transistors so as to provide for independent operation of each of the first plurality of amplifying transistors, and wherein a number of the first plurality of amplifying transistors in operation corresponds to a transistor width of the receiver circuit; and
a second inductive circuit including:
a second plurality of amplifying transistors connected in series and effective to receive an output of the first plurality of amplifying transistors; and
a second plurality of control transistors, wherein each of the second plurality of control transistors is connected to one of the second plurality of amplifying transistors, wherein each second control transistor is effective to receive the independent control signal at a gate of the second control transistor and output to one of the second amplifying transistors so as to provide for independent operation of each of the second plurality of amplifying transistors, and wherein a number of the second plurality of amplifying transistors in operation corresponds to the transistor width of the receiver circuit;

wherein adjustment of a gain of the second plurality of amplifying transistors adjusts an inductance of the first inductive circuit and the second inductive circuit; and a bias generation circuit that includes circuitry effective to mimic operation of the first plurality of amplifying in transistors and the first plurality of control transistors the bias generation circuit includes a first set of transistors with gates and effective to receive the independent control signals at respective gates and a second set of transistors effective to receive an RF reference bias current input and the bias generation circuit effective to output an RF bias control voltage to the second plurality of amplifying transistors, the RF bias control voltage corresponding to a value of the transistor width, the first set of transistors of the bias control circuit being equal in number to the first plurality of control transistors.

19. The inductively degenerated low noise signal amplifier of claim 18, wherein a real component of input impedance to the first inductive circuit is a function of transconductance of the first plurality of amplifying transistors and varies based on the transistor width, and wherein an imaginary component of the input impedance is tuned out with an inductor connected in series with the first plurality of amplifying transistors.

20. The inductively degenerated low noise signal amplifier of claim 19, wherein the input impedance is held substantially constant by adjustment of a gain of the second plurality of transistors to substantially match a gain of the first plurality of amplifying transistors.

21. The inductively degenerated low noise signal amplifier of claim 19, wherein the input impedance is held substantially constant by adjustment of a source degeneration inductance in the same proportion as adjusting the first plurality of amplifying transistors transconductance.

22. The inductively degenerated low noise signal amplifier of claim 19, wherein adjustment of the first plurality of amplifying transistors transconductance comprises adjustment of the transistor width of the first plurality of amplifying transistors.

* * * * *

UNITED STATES PATENT AND TRADEMARK OFFICE
CERTIFICATE OF CORRECTION

PATENT NO. : 8,442,464 B2  
APPLICATION NO. : 12/551038  
DATED : May 14, 2013  
INVENTOR(S) : Amrutur et al.

Page 1 of 1

It is certified that error appears in the above-identified patent and that said Letters Patent is hereby corrected as shown below:

On the Title Page, item (73), under "Assignee", in Column 1, Line 1, delete "Science Bangalore," and insert -- Science, Bangalore, --, therefor.

Signed and Sealed this  
Third Day of September, 2013

Teresa Stanek Rea  
*Acting Director of the United States Patent and Trademark Office*